(12) United States Patent
Bao et al.

(10) Patent No.: US 11,004,850 B2
(45) Date of Patent: May 11, 2021

(54) VERTICAL FIN FIELD EFFECT TRANSISTOR DEVICES WITH A REPLACEMENT METAL GATE

(71) Applicant: INTERNATIONAL BUSINESS MACHINES CORPORATION, Armonk, NY (US)

(72) Inventors: Ruqiang Bao, Niskayuna, NY (US); Junli Wang, Slingerlands, NY (US); Michael P. Belyansky, Halfmoon, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/847,350

(22) Filed: Apr. 13, 2020

(65) Prior Publication Data
US 2020/0243526 A1    Jul. 30, 2020

Related U.S. Application Data

(62) Division of application No. 16/182,023, filed on Nov. 6, 2018, now Pat. No. 10,679,993.

(51) Int. Cl.
*H01L 21/324* (2006.01)
*H01L 27/092* (2006.01)
(Continued)

(52) U.S. Cl.
CPC ...... *H01L 27/0924* (2013.01); *H01L 21/0217* (2013.01); *H01L 21/28525* (2013.01);
(Continued)

(58) Field of Classification Search
CPC . H01L 21/02; H01L 21/0217; H01L 21/0324; H01L 21/8238; H01L 21/28525;
(Continued)

(56) References Cited

U.S. PATENT DOCUMENTS 9,525,064 B1  12/2016  Balakrishnan et al.
9,680,473 B1   6/2017  Anderson et al.
(Continued)

OTHER PUBLICATIONS

List of IBM Patents or Patent Applications Treated as Related dated Apr. 13, 2020, 2 pages.
(Continued)

*Primary Examiner* — Chuong A Luu
(74) *Attorney, Agent, or Firm* — Tutunjian & Bitetto, P.C.; Douglas Pearson

(57) ABSTRACT

A method of forming a fin field effect transistor complementary metal oxide semiconductor (CMOS) device is provided. The method includes forming a plurality of multilayer fin templates and vertical fins on a substrate, wherein one multilayer fin template is on each of the plurality of vertical fins. The method further includes forming a dummy gate layer on the substrate, the plurality of vertical fins, and the multilayer fin templates, and removing a portion of the dummy gate layer from the substrate from between adjacent pairs of the vertical fins. The method further includes forming a fill layer between adjacent pairs of the vertical fins. The method further includes removing a portion of the dummy gate layer from between the fill layer and the vertical fins, and forming a sidewall spacer layer on the fill layer and between the fill layer and the vertical fins.

20 Claims, 10 Drawing Sheets

(51) Int. Cl.
*H01L 21/8238* (2006.01)
*H01L 29/66* (2006.01)
*H01L 21/02* (2006.01)
*H01L 21/285* (2006.01)
*H01L 21/8234* (2006.01)

(52) U.S. Cl.
CPC ........... *H01L 21/823418* (2013.01); *H01L 21/823821* (2013.01); *H01L 29/6653* (2013.01); *H01L 29/66545* (2013.01)

(58) Field of Classification Search
CPC ....... H01L 21/31055; H01L 21/823431; H01L 21/823437; H01L 21/823821; H01L 21/823878; H01L 21/823418; H01L 21/823842; H01L 21/823885; H01L 21/823864; H01L 27/092; H01L 27/0922; H01L 27/0924; H01L 27/11807; H01L 29/4966; H01L 29/48642; H01L 29/66772; H01L 29/42392; H01L 29/6653; H01L 29/66545
USPC ......................................................... 257/369
See application file for complete search history.

(56) References Cited

U.S. PATENT DOCUMENTS

| | | |
|---|---|---|
| 9,773,708 B1 | 9/2017 | Zhang et al. |
| 9,780,208 B1 | 10/2017 | Xie et al. |
| 9,799,749 B1 | 10/2017 | Bi et al. |
| 9,805,935 B2 | 10/2017 | Anderson et al. |
| 9,859,421 B1 | 1/2018 | Robinson et al. |
| 9,882,047 B2 | 1/2018 | Leobandung |
| 9,960,254 B1 | 5/2018 | Bao et al. |
| 2014/0015055 A1* | 1/2014 | Flachowsky ...... H01L 29/66545 257/368 |
| 2016/0293602 A1* | 10/2016 | Liu .................. H01L 29/66893 |
| 2017/0373166 A1 | 12/2017 | Bergendahl et al. |
| 2017/0373167 A1 | 12/2017 | Bergendahl et al. |
| 2018/0019340 A1 | 1/2018 | Adusumilli et al. |
| 2018/0122941 A1 | 5/2018 | Ching et al. |

OTHER PUBLICATIONS

U.S. Notice of Allowance issued in U.S. Appl. No. 16/847,122 dated Feb. 18, 2021, pp. 1-14.

* cited by examiner

VERTICAL FIN FIELD EFFECT TRANSISTOR DEVICES WITH A REPLACEMENT METAL GATE

BACKGROUND

Technical Field

The present invention generally relates to vertical fin field effect transistor (FinFET) devices, and more particularly to FinFETs with replacement metal gates.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a fin field effect transistor complementary metal oxide semiconductor (CMOS) device is provided. The method includes forming a plurality of multilayer fin templates and vertical fins on a substrate, wherein one multilayer fin template is on each of the plurality of vertical fins. The method further includes forming a dummy gate layer on the substrate, the plurality of vertical fins, and the multilayer fin templates. The method further includes removing a portion of the dummy gate layer from the substrate from between adjacent pairs of the vertical fins. The method further includes forming a fill layer between adjacent pairs of the vertical fins. The method further includes removing a portion of the dummy gate layer from between the fill layer and the vertical fins, and forming a sidewall spacer layer on the fill layer and between the fill layer and the vertical fins.

In accordance with another embodiment of the present invention, a method of forming a fin field effect transistor complementary metal oxide semiconductor (CMOS) device is provided. The method includes forming a bottom source/drain layer on a substrate. The method further includes forming a plurality of multilayer fin templates and vertical fins on the bottom source/drain layer, wherein one multilayer fin template is on each of the plurality of vertical fins. The method further includes forming a bottom spacer layer on the bottom source/drain layer and the plurality of vertical fins. The method further includes forming a gate dielectric layer on the plurality of vertical fins and the bottom spacer layer, and forming a dummy gate layer on the gate dielectric layer, and the multilayer fin templates. The method further includes removing a portion of the dummy gate layer from the gate dielectric layer from between adjacent pairs of the vertical fins, and forming a fill layer on the gate dielectric layer between adjacent pairs of the vertical fins. The method further includes removing a portion of the dummy gate layer from between the fill layer and the vertical fins, and forming a sidewall spacer layer on the fill layer and between the fill layer and the vertical fins.

In accordance with another embodiment of the present invention, a fin field effect transistor complementary metal oxide semiconductor (CMOS) device is provided. The device includes a bottom source/drain layer on a substrate. The device further includes a plurality of vertical fins in a first subset and a plurality of vertical fins in a second subset on the bottom source/drain layer. The device further includes a gate dielectric layer on each of the plurality of vertical fins in the first subset and the plurality of vertical fins in the second subset. The device further includes a work function layer on the gate dielectric layer on the plurality of vertical fins in the second subset, and a replacement work function material on the gate dielectric layer on the plurality of vertical fins in the first subset. The device further includes a sidewall spacer on the replacement work function material and gate dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide an approach to fabricating vertical transport fin field effect transistor (VT FinFET) devices with replacement metal gates that provides for forming n-type VT FinFETs and p-type VTFinFETs adjacent to each other on a substrate. A shared gate complementary metal oxide semiconductor (CMOS) device can be formed with replacement metal gates. A conformal Si can be used to form a dummy gate, and a late gate replacement can be used to form an active gate having the same gate length dummy gate.

Embodiments of the present invention provide a vertical transport fin field effect transistor (VT FinFET) devices with replacement metal gates with an active gate having the same gate length dummy gate. An amorphous silicon can be conformally deposited as a dummy gate layer that determines the gate size of a subsequently formed active gate. Different work function layers and conductive gate fills can be used to form n-type VT FinFETs and p-type VTFinFETs adjacent to each other on the substrate. A shared gate complementary metal oxide semiconductor (CMOS) device can be formed with the replacement metal gates.

Exemplary applications/uses to which the present invention can be applied include, but are not limited to: transistor device based memory cells (e.g., static random access memory (SRAM), dynamic random access memory (DRAM), latches, etc.), and transistor based logic cells (e.g., NAND gates, NOR gates, XOR gates, flip-flops, etc.).

It is to be understood that aspects of the present invention will be described in terms of a given illustrative architecture; however, other architectures, structures, substrate materials and process features and steps can be varied within the scope of aspects of the present invention.

Figure 1:
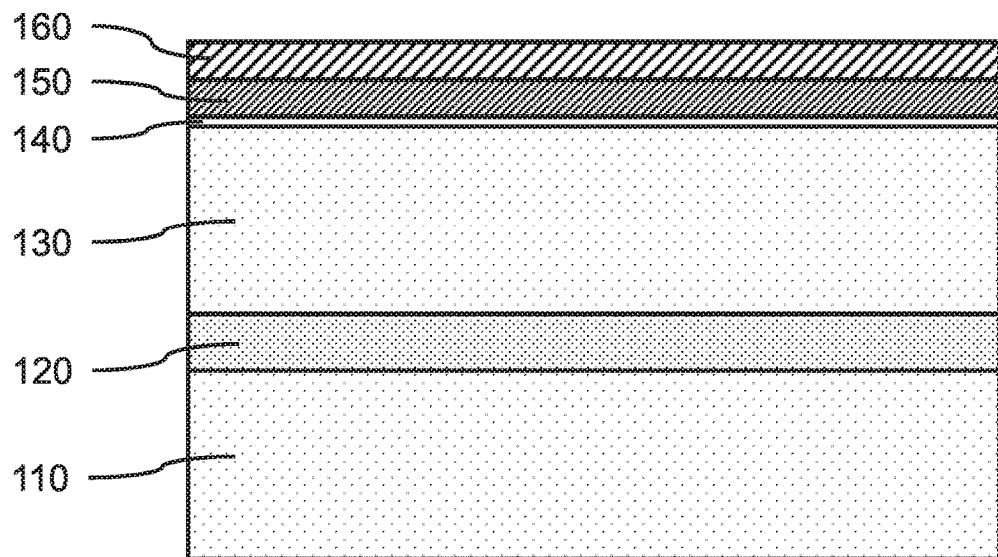
FIG. 1 is a cross-sectional side view showing a bottom source/drain layer on a substrate, a fin layer on the bottom source/drain layer, a fin template liner on the fin layer, a first fin template layer on the fin liner, and a second fin template layer on the first fin template layer, in accordance with an embodiment of the present invention.

Referring now to the drawings in which like numerals represent the same or similar elements and initially to FIG. 1, a cross-sectional side view of a bottom source/drain layer on a substrate, a fin layer on the bottom source/drain layer, a fin template liner on the fin layer, a first fin template layer on the fin liner, and a second fin template layer on the first fin template layer is shown, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)). In various embodiments, the substrate 110 can be a single crystal wafer.

In one or more embodiments, a bottom source/drain layer 120 can be formed on a substrate 110, where the bottom source/drain layer 120 can be formed by implantation and/or an epitaxial or heteroepitaxial growth process, for example, molecular beam epitaxy (MBE), liquid phase epitaxy (LPE), or gas phase epitaxy (GPE). The bottom source/drain layer 120 can be doped to be an n-type bottom source/drain layer or a p-type bottom source/drain layer, where the dopant(s) can be introduced in situ (i.e., during formation of a layer) or ex situ (i.e., after formation of a layer). In various embodiments, n-type dopants can be, for example, phosphorus (P) or arsenic (As), and p-type dopants can be, for example, boron (B) or gallium (Ga). In various embodiments, the bottom source/drain layer 120 can be a semiconductor material, including, but not limited to n-type (e.g., P or As) doped silicon (Si) or p-type (e.g., B) doped silicon-germanium (SiGe). The bottom source/drain layer 120 can be the same semiconductor material as the substrate 110 or different.

In various embodiments, the bottom source/drain layer 120 can have a thickness in a range of about 10 nm to about 40 nm, or about 20 nm to about 30 nm, although other thicknesses are also contemplated.

In one or more embodiments, a fin layer 130 can be formed on the bottom source/drain layer 120 and substrate 110, where the fin layer can be formed by an epitaxial or heteroepitaxial growth process. The fin layer 130 can have the same crystal orientation as the substrate 110 and bottom source/drain layer 120.

In various embodiments, the fin layer 130 can be a semiconductor material, where the fin layer 130 can be the same semiconductor material as the substrate 110 and/or the bottom source/drain layer 120, or the fin layer 130 can be a different semiconductor material than the substrate 110 and/or the bottom source/drain layer 120. Use of a different semiconductor material for the fin layer 130 can be used to impart a stress in the fin layer.

In one or more embodiments, a fin template liner 140 can be formed on the fin layer 130, where the fin template liner 140 can be a semiconductor oxide formed by a thermal oxidation reaction of the exposed surface of the fin layer 130 or by a conformal deposition, for example, atomic layer deposition (ALD), plasma enhanced ALD (PEALD), or low pressure CVD (LPCVD). In various embodiments, the fin template liner 140 can be silicon oxide (SiO).

In various embodiments, a first fin template layer 150 can be formed on the fin template liner 140, where the first fin template layer 150 can be formed by a conformal or blanket deposition, for example, chemical vapor deposition (CVD) or plasma enhanced CVD (PECVD) to a predetermined thickness, or etched back to an intended thickness, e.g., using an isotropic etch.

In various embodiments, the first fin template layer 150 can be a hardmask material, including, but not limited to, silicon nitride (SiN), silicon oxynitride (SiON), silicon carbonitride (SiCN), silicon boronitride (SiBN), silicon borocarbide (SiBC), silicon boro carbonitride (SiBCN), or combinations thereof, where the first fin template layer 150 can be a hardmask material different from the fin template liner 140 to provide etch selectivity.

In various embodiments, a second fin template layer 160 can be formed on the first fin template layer 150, where the second fin template layer 160 can be formed by a conformal or blanket deposition, for example, chemical vapor deposition (CVD) or plasma enhanced CVD (PECVD) to a predetermined thickness, or etched back to an intended thickness, e.g., using an isotropic etch.

In various embodiments, the second fin template layer 160 can be a hardmask material, including, but not limited to, silicon nitride (SiN), silicon oxynitride (SiON), silicon carbonitride (SiCN), silicon boronitride (SiBN), silicon borocarbide (SiBC), silicon boro carbonitride (SiBCN), or combinations thereof, where the second fin template layer 160 can be a hardmask material different from the fin template liner 140 and first fin template layer 150 to provide etch selectivity.

Figure 2:
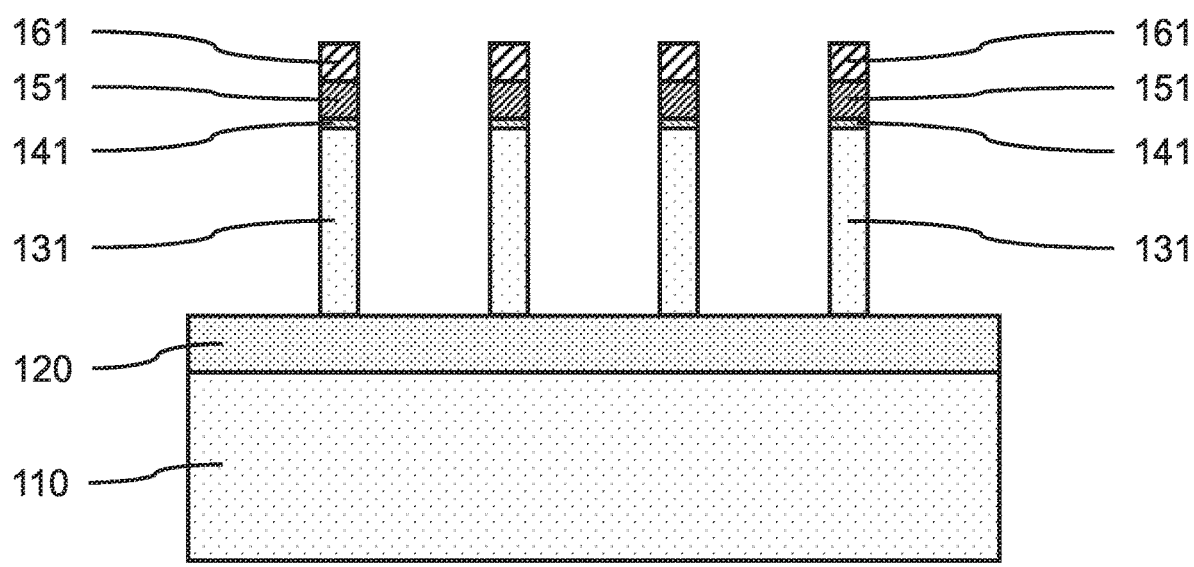
FIG. 2 is a cross-sectional side view showing a plurality of vertical fins formed from the fin layer, and a multilayer fin template formed from the fin template liner, first fin template layer, and second fin template layer on each of the vertical fins, in accordance with an embodiment of the present invention.

FIG. 2 is a cross-sectional side view showing a plurality of vertical fins formed from the fin layer, and a multilayer fin template formed from the fin template liner, first fin template layer, and second fin template layer on each of the vertical fins, in accordance with an embodiment of the present invention.

In one or more embodiments, one or more vertical fins 131 with a multilayer fin template can be formed on the bottom source/drain layer 120 and substrate 110. The vertical fins 131 and fin templates can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins 131 may be formed by a direct write process or double patterning process using, for example, immersion lithography, extreme ultraviolet lithography, or x-ray lithography. The multilayer fin templates including a second fin template slab 161, a first fin template slab 151, and a fin liner plate 141 can be formed from the second fin template layer 160, first fin template layer 150, and fin template liner 140 previously formed on the fin layer 130, as part of the patterning process. A sequence of selective, directional etches, for example, a reactive ion etch (RIE), can be used to form the vertical fins 131 and multilayer fin templates.

In various embodiments, the widths of the semiconductor vertical fin(s) 131 can be in a range of about 5 nanometers (nm) to about 15 nm, or about 6 nm to about 10 nm, or about 6 nm to about 8 nm, although other widths are also contemplated.

In various embodiments, the height of the semiconductor vertical fin(s) 131 can be in a range of about 20 nanometers (nm) to about 100 nm, or about 30 nm to about 50 nm, although other heights are also contemplated. Although the vertical fins 131 are depicted in the figures perpendicular to the substrate 110 (i.e., having a 90 degree angle), the fins can have a tapered sidewall that does not meet the substrate at a right angle (i.e., not exactly 90 degree). The top surface of the vertical fins 131 may not be perfectly flat or rectangular, but may have a convex curved surface. The substrate surface can have a curved (recessed) profile between the vertical fins 131. In various embodiments, the bottom source/drain layer 120 can be formed after formation of the vertical fin(s) 130, where the bottom source/drain layer can be formed by dopant implantation.

Figure 3:
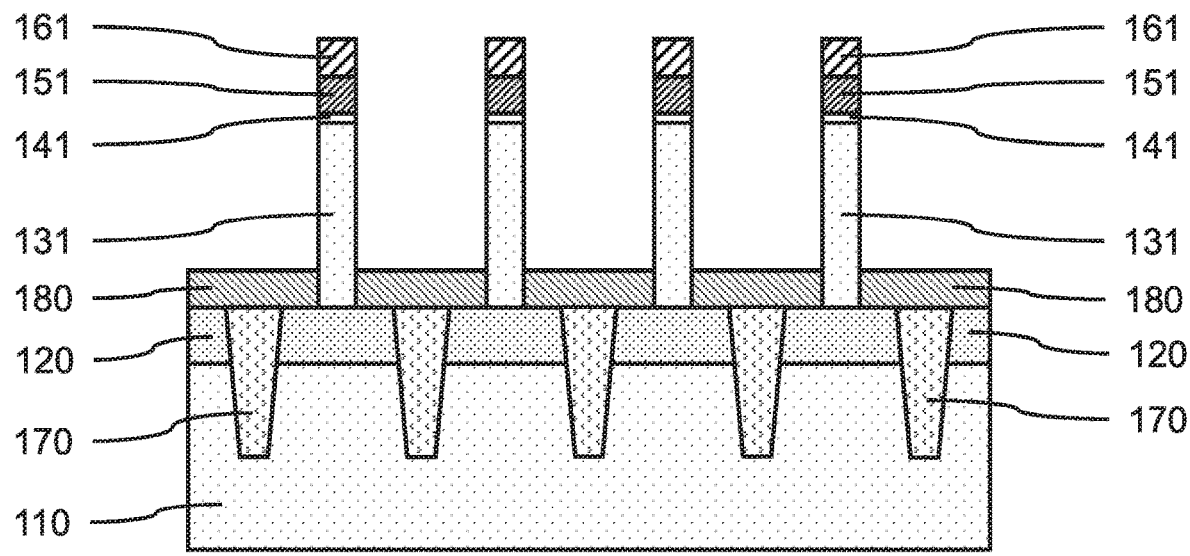
FIG. 3 is a cross-sectional side view showing a bottom spacer layer formed on the bottom source/drain layer and plurality of vertical fins, in accordance with an embodiment of the present invention.

FIG. 3 is a cross-sectional side view showing a bottom spacer layer formed on the bottom source/drain layer and plurality of vertical fins, in accordance with an embodiment of the present invention.

In one or more embodiments, an isolation region 170 can be formed through the bottom source/drain layer 120 to electrically separate the bottom source/drain layer into different segments below the vertical fins 131. The isolation region(s) 170 can be formed by etching a trench through the bottom source/drain layer 120 and into the substrate 110, and filling the trench with a dielectric material, for example, silicon oxide (SiO). The isolation region(s) 170 can be formed between adjacent pairs of vertical fins 131.

In one or more embodiments, a bottom spacer layer 180 can be formed on the bottom source/drain layer 120 and isolation regions 170, where the bottom spacer layer 180 can be formed by a directional deposition to a predetermined thickness, for example, by a high density plasma (HDP) or gas cluster ion beam (GCIB), or by a blanket deposition, for example, chemical vapor deposition (CVD) or plasma enhanced CVD (PECVD) and etched back to an intended thickness, e.g., using an isotropic etch.

In various embodiments, the bottom spacer layer 180 can have a thickness in a range of about 3 nm to about 10 nm, or about 5 nm to about 7 nm, although other thicknesses are also contemplated. The bottom spacer layer 180 can cover a lower portion of the vertical fins 131 up to the thickness of the bottom spacer layer.

In various embodiments, the bottom spacer layer 180 can be a dielectric material, including, but not limited to, silicon oxide (SiO), silicon nitride (SiN), silicon oxynitride (SiON), silicon carbonitride (SiCN), silicon boronitride (SiBN), silicon borocarbide (SiBC), silicon boro carbonitride (SiBCN), or combinations thereof. The bottom spacer layer 180 can be a material different from the fin template slabs and plate to allow selective removal.

Figure 4:
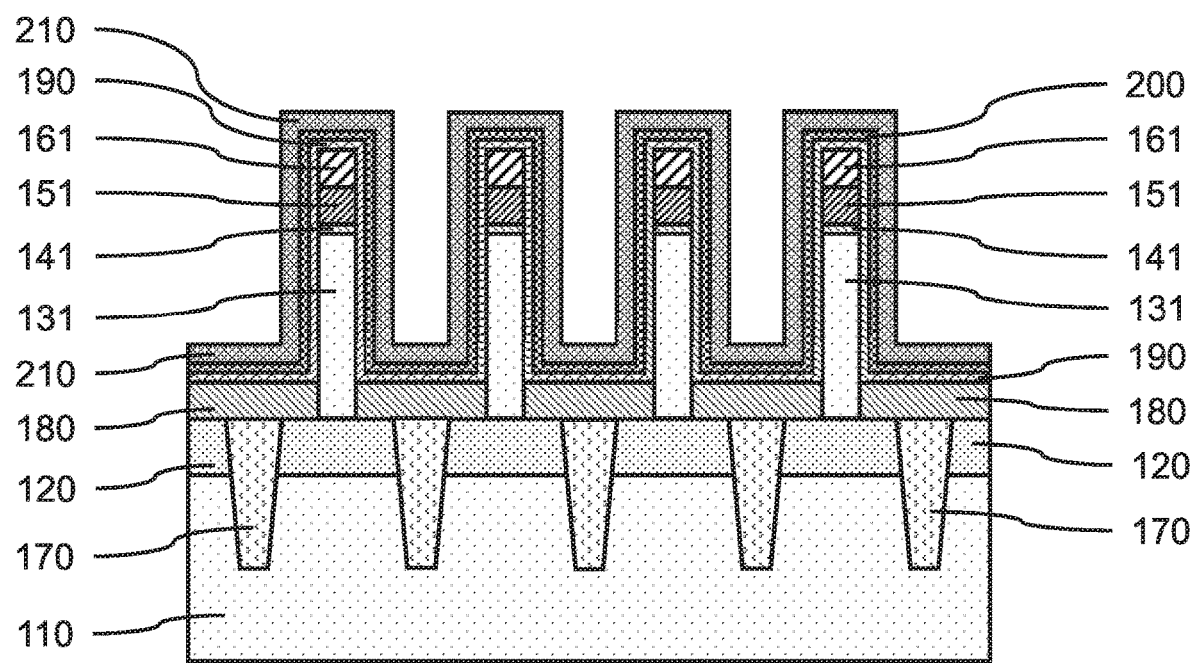
FIG. 4 is a cross-sectional side view showing a gate dielectric layer formed on the bottom spacer layer, walls of the plurality of vertical fins and multilayer fin template, a first work function layer formed on the gate dielectric layer, and a dummy gate layer formed on the first work function layer, in accordance with an embodiment of the present invention.

FIG. 4 is a cross-sectional side view showing a gate dielectric layer formed on the bottom spacer layer, walls of the plurality of vertical fins and multilayer fin template, a first work function layer formed on the gate dielectric layer, and a dummy gate layer formed on the first work function layer, in accordance with an embodiment of the present invention.

In one or more embodiments, a gate dielectric layer 190 can be formed on the bottom spacer layer 180 and the plurality of vertical fins 131 and multilayer fin templates, where the gate dielectric layer 190 can be formed by a conformal deposition, for example, atomic layer deposition (ALD), plasma enhanced ALD (PEALD), or low pressure CVD (LPCVD). The gate dielectric layer 190 can cover exposed surfaces of the bottom spacer layer 180, vertical fins 131, and multilayer fin templates.

In various embodiments, the gate dielectric layer 190 can be a dielectric material, including, but not limited to, silicon oxide (SiO), silicon nitride (SiN), silicon oxynitride (SiON), silicon boronitride (SiBN), silicon boro carbonitride (SiBCN), silicon carbonitride (SiCN), silicon oxycarbonitride (SiOCN), a high-k dielectric, and combinations thereof. Examples of high-k materials include but are not limited to metal oxides, such as, hafnium oxide (HfO), hafnium silicon oxide (HfSiO), hafnium silicon oxynitride (HfSiON), lanthanum oxide (LaO), lanthanum aluminum oxide (LaAlO), zirconium oxide (ZrO), zirconium silicon oxide (ZrSiO), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), lead scandium tantalum oxide (PbScTaO), and lead zinc niobate (PbZnNbO). The high-k material may further include dopants such as lanthanum, aluminum, magnesium, or combinations thereof.

In various embodiments, the gate dielectric layer 190 can have a thickness in a range of about 1 nm to about 3 nm, or about 2 nm, although other thicknesses are also contemplated.

In one or more embodiments, a work function layer 200 can be formed on the gate dielectric layer 190, where the work function layer 200 can be formed by a conformal deposition.

In various embodiments, the work function layer 200 can be a conducting transition metallic nitride or carbide compound material, for example, tantalum nitride (TaN), titanium nitride (TiN), tantalum carbide (TaC), titanium carbide (TiC), titanium aluminum carbide (TiAlC), and combinations thereof.

In one or more embodiments, a dummy gate layer 210 can be formed on the work function layer 200, where the dummy gate layer 210 can be formed by a conformal deposition, (e.g., ALD, PEALD, LPCVD). In various embodiments, dummy gate layer 210 can be amorphous silicon (a-Si).

Figure 5:
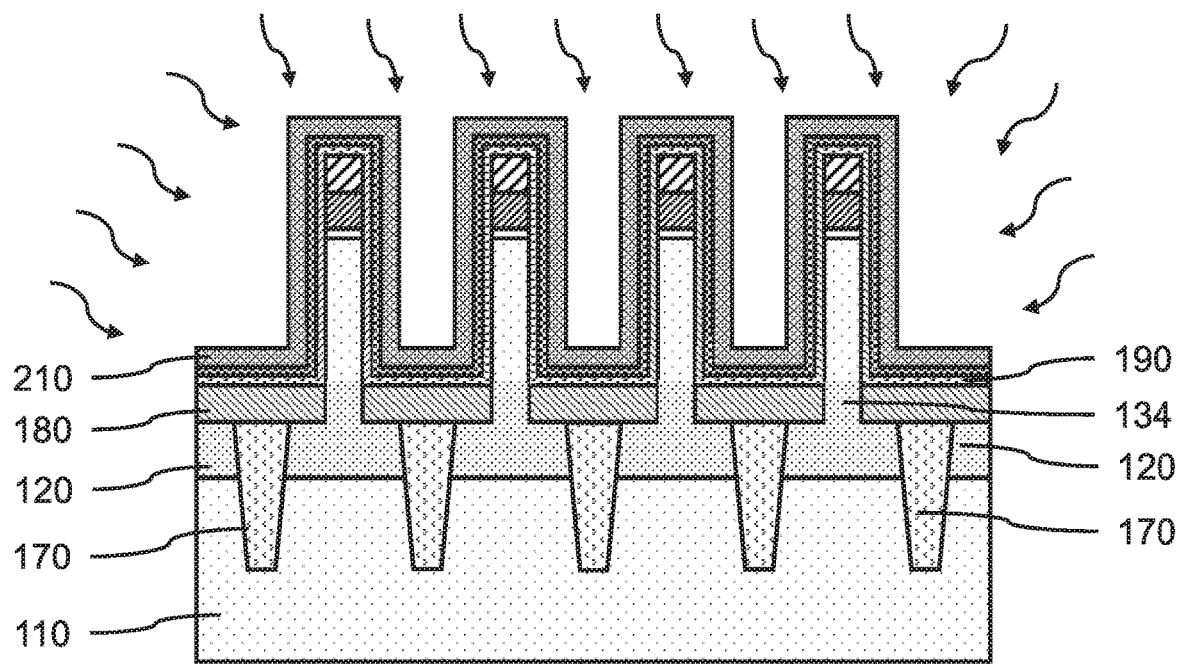
FIG. 5 is a cross-sectional side view showing a heat treatment of the vertical fins, multilayer fin templates, gate dielectric layer, bottom spacer layer, first work function layer formed, and dummy gate layer, in accordance with an embodiment of the present invention.

FIG. 5 is a cross-sectional side view showing a heat treatment of the vertical fins, multilayer fin templates, gate dielectric layer, bottom spacer layer, first work function layer formed, and dummy gate layer, in accordance with an embodiment of the present invention.

In one or more embodiments, the vertical fins, multilayer fin templates, gate dielectric layer, bottom spacer layer, first work function layer formed, and dummy gate layer can undergo a heat treatment to anneal the formed features and layers.

In various embodiments, the heat treatment can be an anneal at a temperature in a range of about 800° C. to about 1100° C., where the thermal budget can be minimized by conducting the anneal for a duration of about 1 millisecond (msec) to about 10 seconds (sec). In various embodiments, a flash anneal, rapid thermal anneal, spike anneal, laser anneal, or any suitable combination of these techniques can be used for the heat treatment.

In one or more embodiments, a lower extension region 134 can be formed in a lower portion of the vertical fins 131, where the lower extension region 134 can be formed by the heat treatment to diffuse dopants from the bottom source/drain layer 120 into the adjoining vertical fins 131. The lower extension region 134 can be adjacent to the bottom spacer layer 180, and may extend above the top surface of the bottom spacer layer to overlap a gate structure.

Figure 6:
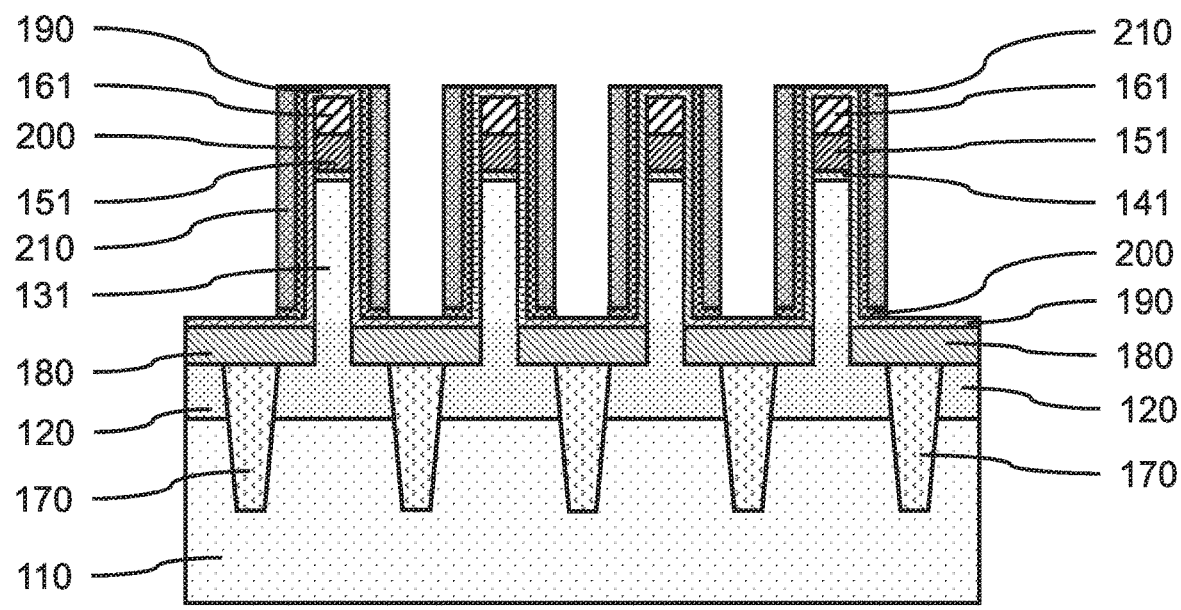
FIG. 6 is a cross-sectional side view showing a portion of the dummy gate layer and work function layer removed from a surfaces of the gate dielectric layer, in accordance with an embodiment of the present invention.

FIG. 6 is a cross-sectional side view showing a portion of the dummy gate layer and work function layer removed from a surfaces of the gate dielectric layer, in accordance with an embodiment of the present invention.

In one or more embodiments, a portion of the dummy gate layer 210 and work function layer 200 removed from a surfaces of the gate dielectric layer, where the dummy gate layer 210 and work function layer 200 can be removed using a sequence of selective directional etches (e.g., RIE). Removal of the portions of the dummy gate layer 210 and work function layer 200 can expose the underlying gate dielectric layer on the second fin template slab 161 and on the bottom spacer layer 180 between adjacent vertical fins 131.

Figure 7:
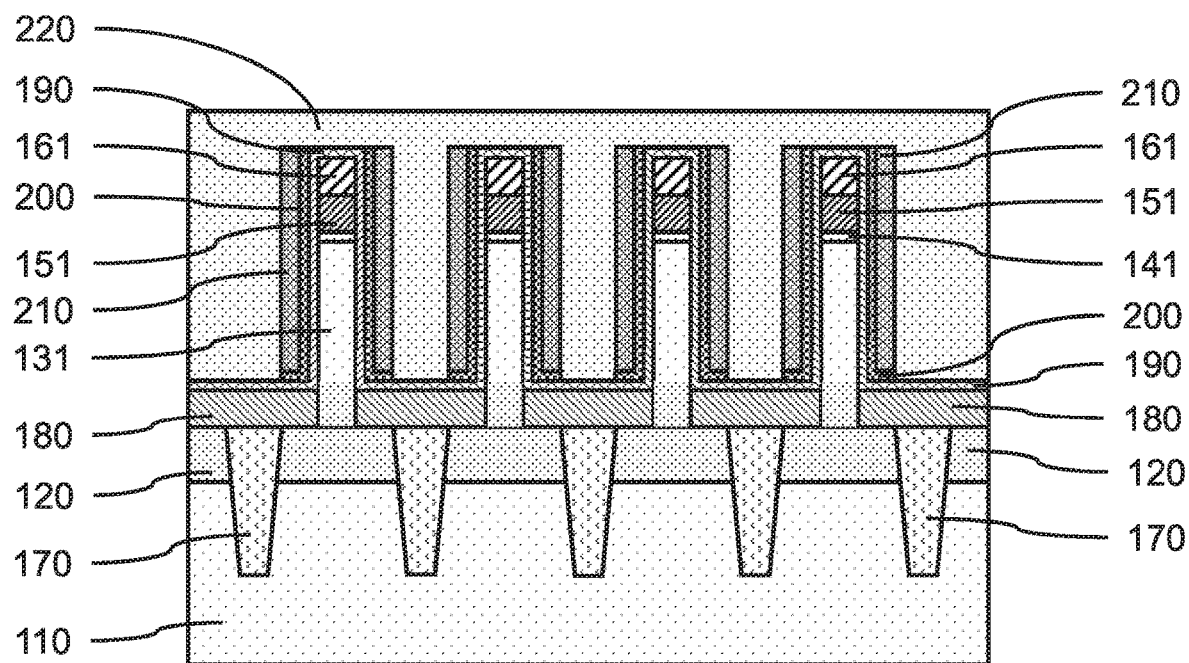
FIG. 7 is a cross-sectional side view showing a fill layer formed in the spaces between the dummy gate layers on adjacent vertical fins, in accordance with an embodiment of the present invention.

FIG. 7 is a cross-sectional side view showing a fill layer formed in the spaces between the dummy gate layers on adjacent vertical fins, in accordance with an embodiment of the present invention.

In one or more embodiments, a fill layer 220 can be formed in the spaces between the dummy gate layers 210 on adjacent vertical fins 131, where the fill layer 220 can be formed by a blanket deposition (e.g., CVD, PECVD) or spun-on. The fill layer 220 can extend above the dummy gate layer 210 and gate dielectric layer 190.

In various embodiments the fill layer 220 can be can be a dielectric material, including, but not limited to, silicon oxide (SiO) or a low-k material. A low-k dielectric material can include, but not be limited to, carbon doped silicon oxide (SiO:C), fluorine doped silicon oxide (SiO:F), silicon carbide (SiC), silicon oxynitride (SiON), silicon-carbon-nitride (SiCN), boron nitride (BN), silicon boron nitride (SiBN), silicon boron carbonitride (SiBCN), silicon oxycabonitride (SiOCN), a polymeric material, for example, tetraethyl orthosilicate (TEOS), hydrogen silsesquioxane (HSQ), methylsilsesquioxane (MSQ), and combinations thereof.

Figure 8:
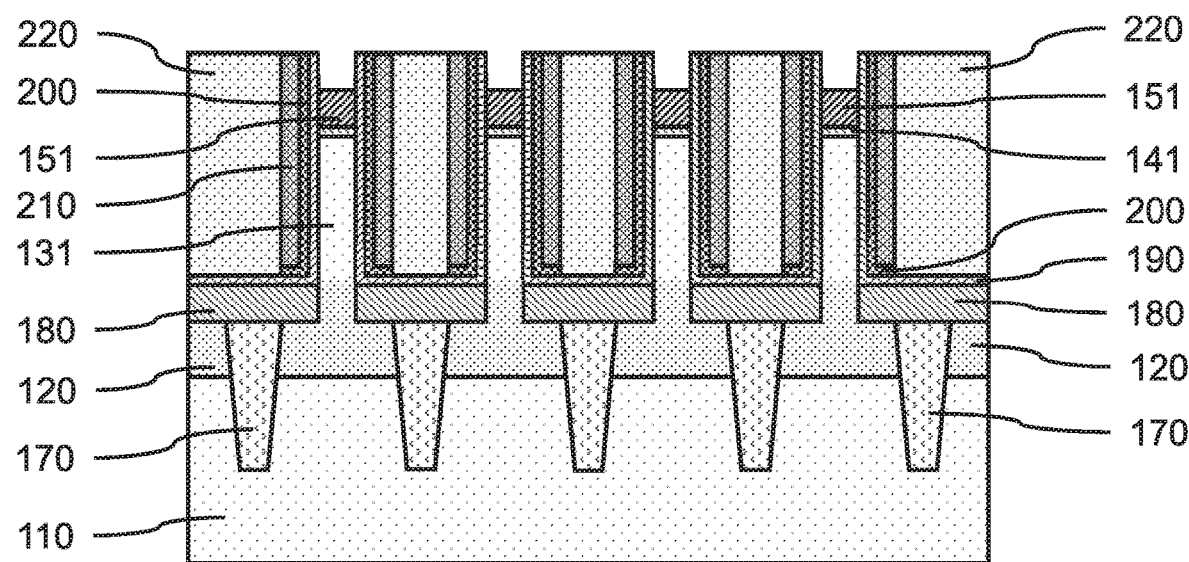
FIG. 8 is a cross-sectional side view showing a portion of the fill layer and gate dielectric layer removed to expose the underlying second fin template slab, and the second fin template slab removed to expose the first fin template slab, in accordance with an embodiment of the present invention.

FIG. 8 is a cross-sectional side view showing a portion of the fill layer and gate dielectric layer removed to expose the underlying second fin template slab, and the second fin template slab removed to expose the first fin template slab, in accordance with an embodiment of the present invention.

In one or more embodiments, a portion of the fill layer 220 and gate dielectric layer 190 can be removed to expose the underlying second fin template slab 161, and the second fin template slab 161 removed to expose the first fin template slab 151. The portion of the fill layer 220 and gate dielectric layer 190 can be removed using a chemical-mechanical polishing (CMP). The second fin template slab 161 can be removed using a selective isotropic etch (e.g., wet chemical etch or dry plasma etch) and/or a selective directional etch (e.g., RIE).

Figure 9:
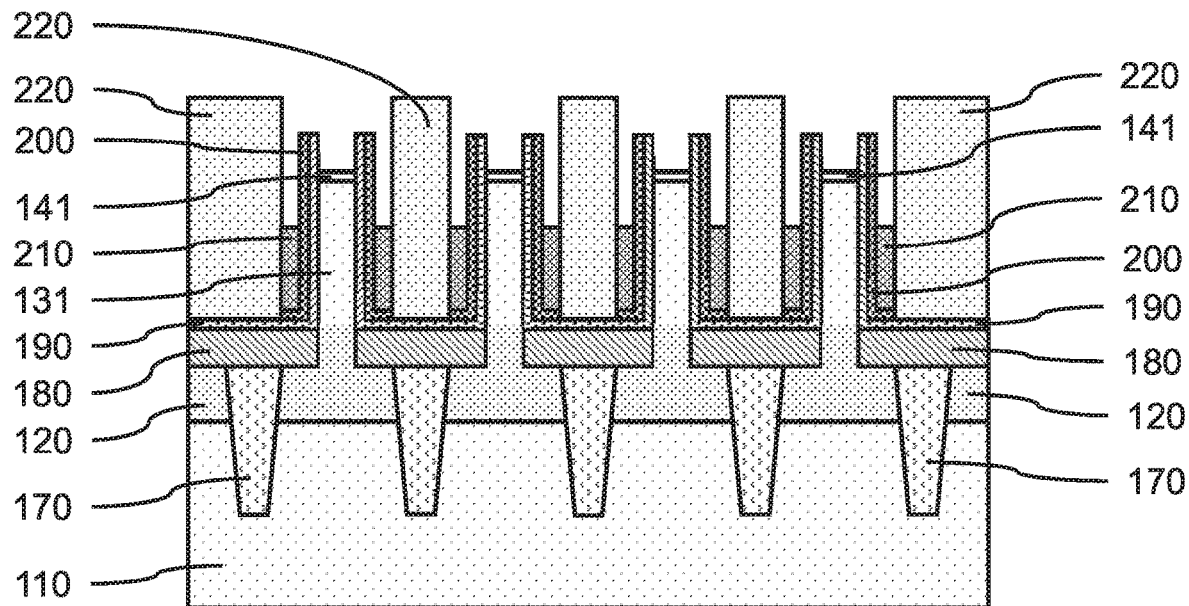
FIG. 9 is a cross-sectional side view showing a portion of the dummy gate layer removed to expose the sidewalls of the work function layer, and the first fin template slab removed to expose the underlying fin liner plate, in accordance with an embodiment of the present invention.

FIG. 9 is a cross-sectional side view showing a portion of the dummy gate layer removed to expose the sidewalls of the work function layer, and the first fin template slab removed to expose the underlying fin liner plate, in accordance with an embodiment of the present invention.

In one or more embodiments, a portion of the dummy gate layer 210 can be removed to expose the sidewalls of the work function layer 200, where the portion of the dummy gate layer 210 can be removed using a selective isotropic etch and/or a selective directional etch.

In one or more embodiments, the first fin template slab 151 can be removed to expose the underlying fin liner plate 141, where the first fin template slab 151 can be removed using a selective isotropic etch and/or a selective directional etch.

Figure 10:
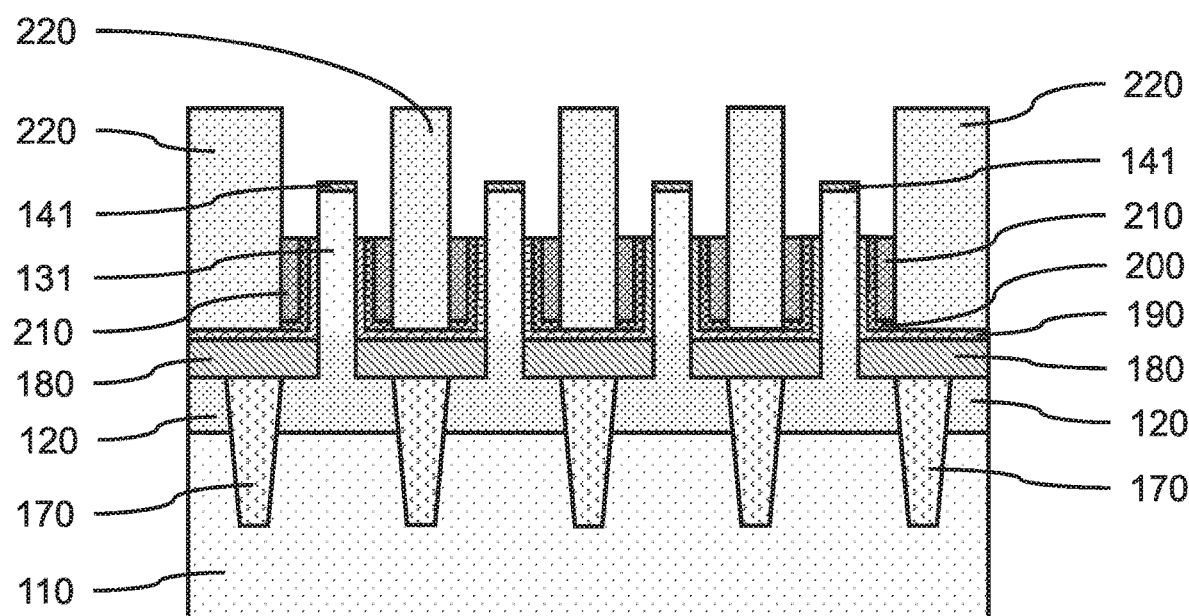
FIG. 10 is a cross-sectional side view showing a portion of the work function layer and gate dielectric layer removed to expose the sidewalls of the vertical fins and fin liner plate, in accordance with an embodiment of the present invention.

FIG. 10 is a cross-sectional side view showing a portion of the work function layer and gate dielectric layer removed to expose the sidewalls of the vertical fins and fin liner plate, in accordance with an embodiment of the present invention.

In one or more embodiments, the exposed portion of the work function layer 200 can be removed using a selective isotropic etch to expose the underlying portion of the gate dielectric layer 190. In various embodiments, the exposed portion of the gate dielectric layer 190 can be removed using a selective isotropic etch to expose an upper portion of the sidewalls of the vertical fins 131.

Figure 11:
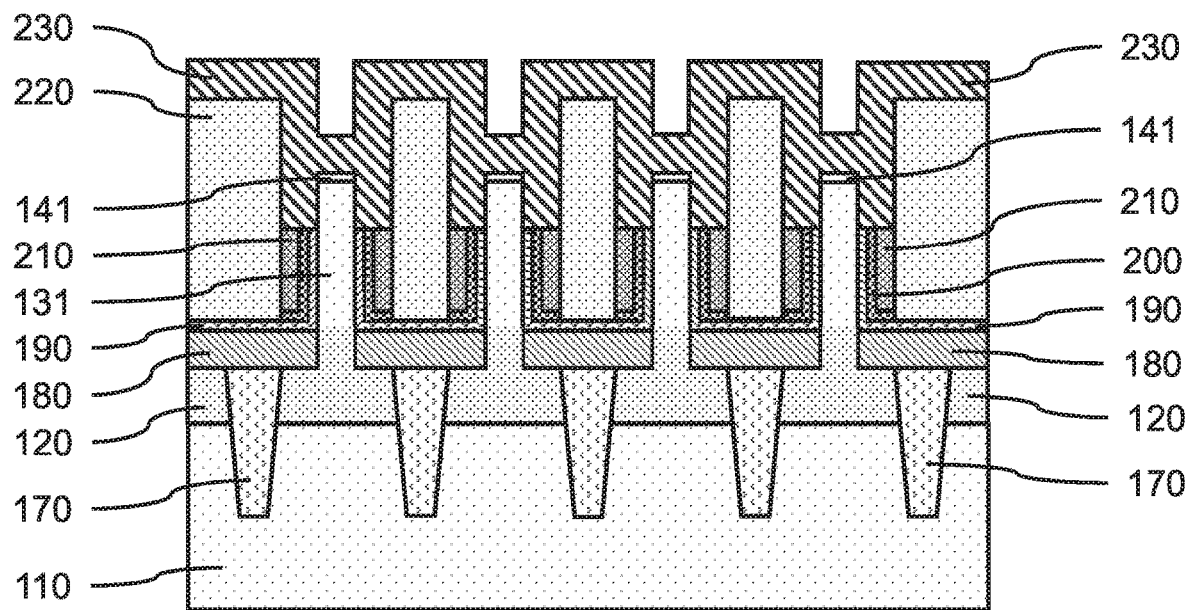
FIG. 11 is a cross-sectional side view showing a sidewall spacer layer formed on the exposed surfaces of the fill layer, dummy gate layer, work function layer, gate dielectric layer, vertical fins, and fin liner plates, in accordance with an embodiment of the present invention.

FIG. 11 is a cross-sectional side view showing a sidewall spacer layer formed on the exposed surfaces of the fill layer, dummy gate layer, work function layer, gate dielectric layer, vertical fins, and fin liner plates, in accordance with an embodiment of the present invention.

In one or more embodiments, a sidewall spacer layer 230 can be formed on the exposed surfaces of the fill layer 220, dummy gate layer 210, work function layer 200, gate dielectric layer 190, vertical fins 131, and fin liner plates 141. The sidewall spacer layer 230 can be formed using a conformal deposition, (e.g., ALD, PEALD), to fill in the space between the sidewalls of the vertical fins 131 and the adjacent fill layer 220. The sidewall spacer layer 230 can be deposited to a thickness that pinches of the space between the sidewalls of the vertical fins 131 and the adjacent fill layer 220 and covers the fin liner plates 141 and fill layer 220. The thickness of the sidewall spacer layer 230 can be increased to greater than half the distance between the sidewalls of the vertical fins 131 and the adjacent fill layer 220, so the sidewall spacer layer 230 has the same thickness on all of the exposed surfaces to control the remaining thicknesses after subsequent etch-back processes.

In various embodiments, the sidewall spacer layer 230 can have a thickness in a range of about 3 nanometers (nm) to about 8 nm, or about 4 nm to about 6 nm, although other widths are also contemplated.

In various embodiments, the sidewall spacer layer 230 can be a hardmask material, including, but not limited to, silicon nitride (SiN), silicon oxynitride (SiON), silicon carbonitride (SiCN), silicon boronitride (SiBN), silicon borocarbide (SiBC), silicon boro carbonitride (SiBCN), or combinations thereof, where the sidewall spacer layer 230 can be a hardmask material different from the fill layer 220 and gate dielectric layer 190 to provide etch selectivity.

Figure 12:
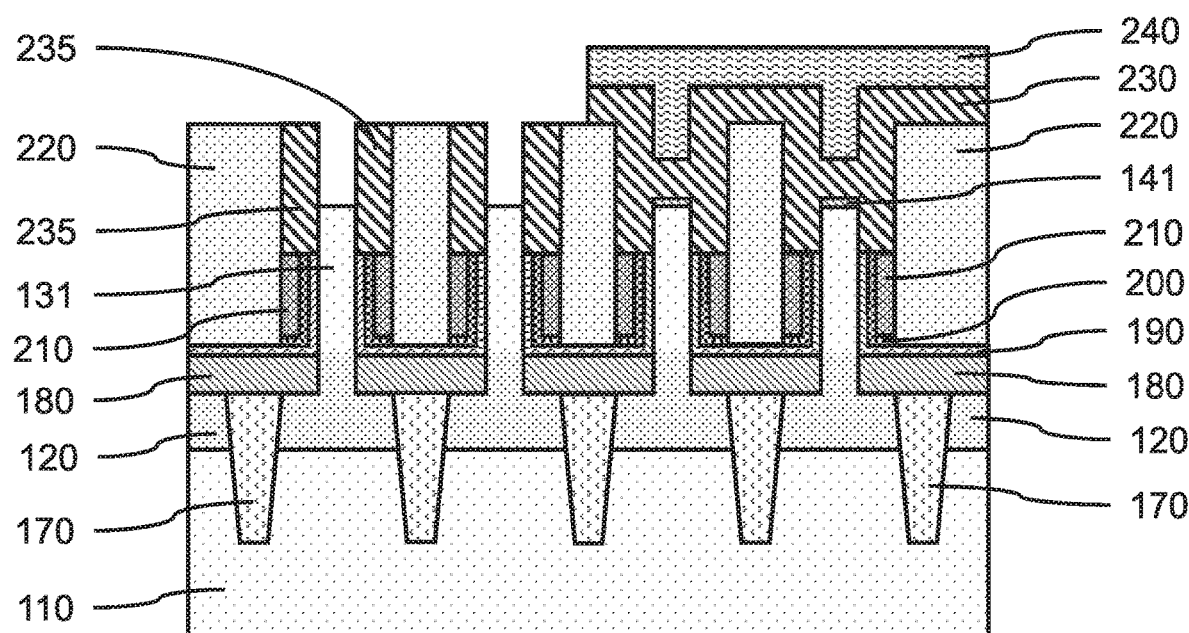
FIG. 12 is a cross-sectional side view showing a masking layer formed on a portion of the sidewall spacer layer, and an exposed portion of the sidewall spacer layer removed from the fill layer to form sidewall spacers between the vertical fins and fill layer, and the exposed fin liner plates removed from the top surfaces of the vertical fins, in accordance with an embodiment of the present invention.

FIG. 12 is a cross-sectional side view showing a masking layer formed on a portion of the sidewall spacer layer, and an exposed portion of the sidewall spacer layer removed from the fill layer to form sidewall spacers between the vertical fins and fill layer, and the exposed fin liner plates removed from the top surfaces of the vertical fins, in accordance with an embodiment of the present invention.

In one or more embodiments, a masking layer 240 can be formed on a portion of the sidewall spacer layer 230, where the masking layer 240 can be an organic planarization layer (OPL). The masking layer 240 can be patterned and etched to expose a portion of the sidewall spacer layer 230 over one or more of the vertical fins 131.

In one or more embodiments, exposed portion of the sidewall spacer layer 230 can be removed from the fill layer 220 and from the fin liner plates 141 on the vertical fins 131 to form sidewall spacers 235 between the vertical fins 131 and fill layer 220. The exposed portion of the sidewall spacer layer 230 can be removed using a selective, directional etch (e.g., RIE).

In one or more embodiments, the exposed fin liner plates 141 removed from the top surfaces of the vertical fins 131 using a selective isotropic etch and/or selective directional etch.

Figure 13:
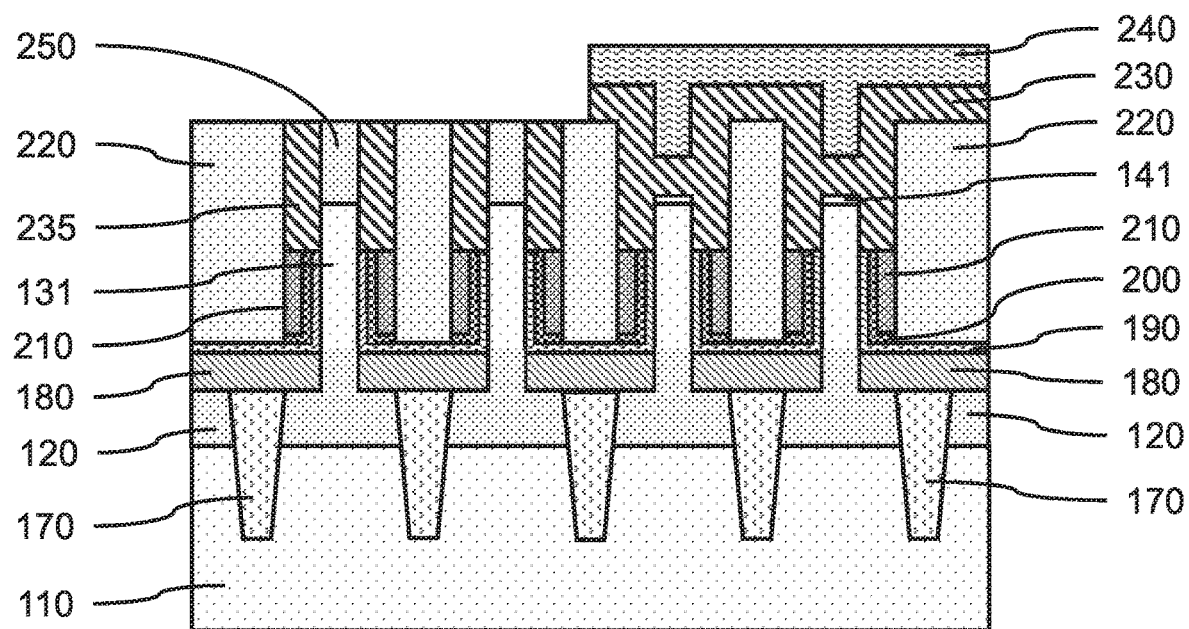
FIG. 13 is a cross-sectional side view showing a top source/drain formed within the sidewall spacers on the exposed top surfaces of the vertical fins, in accordance with an embodiment of the present invention.

FIG. 13 is a cross-sectional side view showing a top source/drain formed within the sidewall spacers on the exposed top surfaces of the vertical fins, in accordance with an embodiment of the present invention.

In one or more embodiments, a first top source/drain 250 can be formed within the sidewall spacers 235 on the exposed top surfaces of the vertical fins 131, where the first top source/drain 250 can be formed by an epitaxial or heteroepitaxial growth process. The first top source/drain 250 can be an n-doped or p-doped semiconductor material, where the dopant type of the first top source/drain 250 can match the dopant type of the bottom source/drain layer 120. The semiconductor material can be the same as or different from the semiconductor material of the vertical fins 131 and/or the bottom source/drain layer 120. In various embodiments, the first top source/drain 250 can be a semiconductor material, including, but not limited to n-type (e.g., P or As) doped silicon (Si) or p-type (e.g., B) doped silicon-germanium (SiGe).

Figure 14:
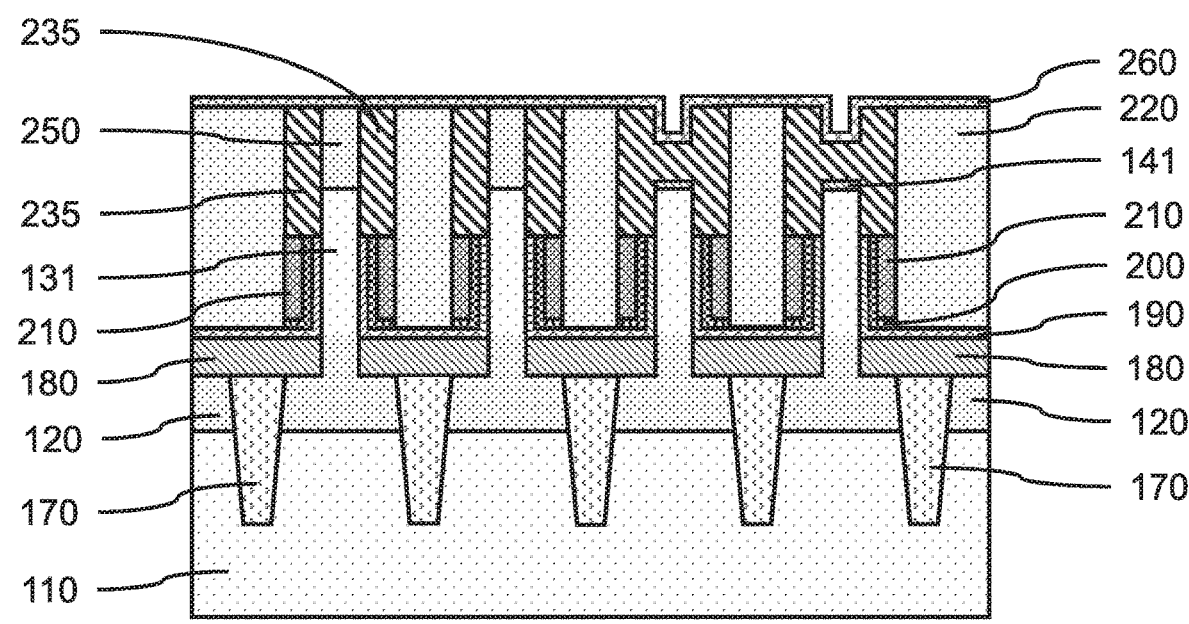
FIG. 14 is a cross-sectional side view showing a protective layer formed on the sidewall spacer layer after removing a masking layer, and on the exposed surfaces of the fill layer, sidewall spacers, and top source/drains, in accordance with an embodiment of the present invention.

FIG. 14 is a cross-sectional side view showing a protective layer formed on the sidewall spacer layer after removing a masking layer, and on the exposed surfaces of the fill layer, sidewall spacers, and top source/drains, in accordance with an embodiment of the present invention.

In one or more embodiments, the masking layer 240 can be removed from the remaining portion of the sidewall spacer layer 230, where the masking layer 240 can be removed, for example, by ashing or a chemical etch.

In one or more embodiments, a protective layer 260 can be formed on the remaining portions of the sidewall spacer layer 230 and the exposed surfaces of the fill layer 220, sidewall spacers 235, and top source/drains 250 after removing the masking layer 240. The protective layer 260 can be formed using a conformal or blanket deposition.

In various embodiments, the protective layer 260 can be a hardmask material. The protective layer 260 can protect the top source/drains 250 during subsequent processing.

Figure 15:
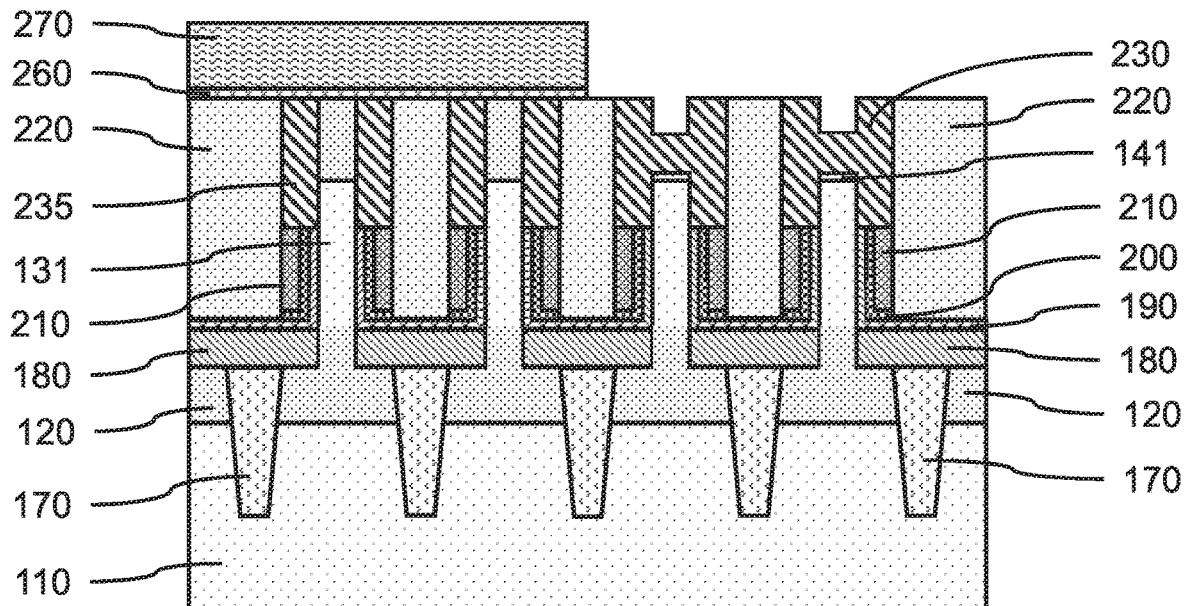
FIG. 15 is a cross-sectional side view showing a second masking layer formed on a portion of the protective layer, in accordance with an embodiment of the present invention.

FIG. 15 is a cross-sectional side view showing a second masking layer formed on a portion of the protective layer, in accordance with an embodiment of the present invention.

In one or more embodiments, a second masking layer 270 formed on a portion of the protective layer 260, where the second masking layer 270 can be an OPL material that is patterned and etched to expose the protective layer 260 over a second subset of vertical fins. In various embodiments, the exposed portion of the protective layer 260 can be removed using a selective isotropic or directional etch to expose the underlying sidewall spacer layer 230.

Figure 16:
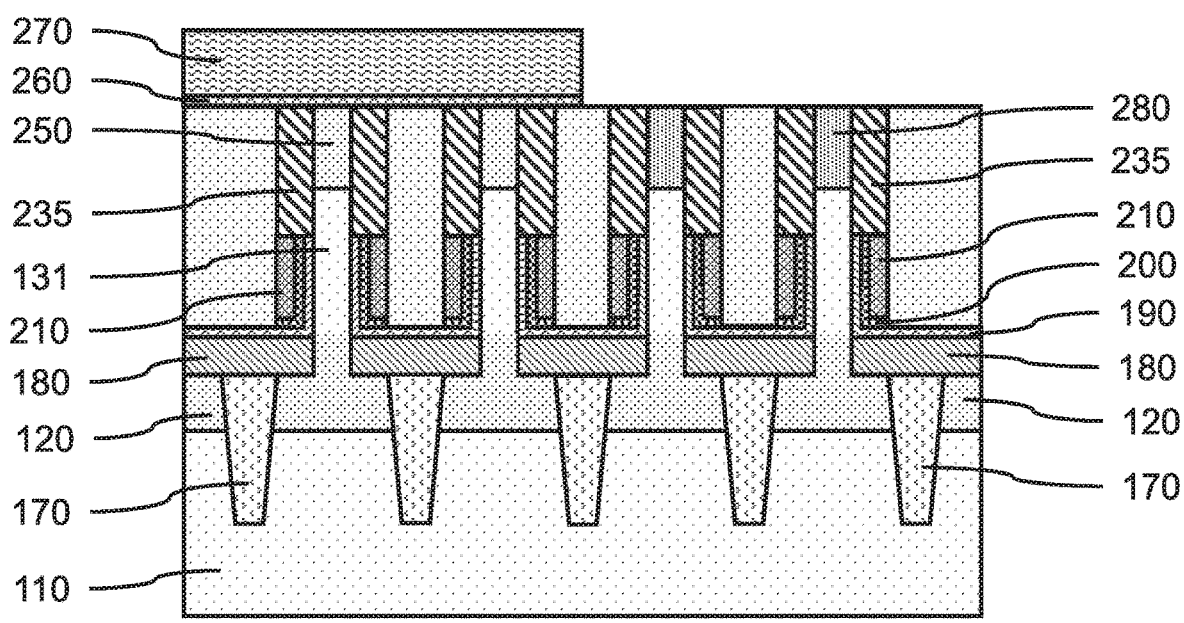
FIG. 16 is a cross-sectional side view showing a top source/drain formed within the sidewall spacers on the exposed top surfaces of the vertical fins after forming sidewall spacers, in accordance with an embodiment of the present invention.

FIG. 16 is a cross-sectional side view showing a top source/drain formed within the sidewall spacers on the exposed top surfaces of the vertical fins after forming sidewall spacers, in accordance with an embodiment of the present invention.

In one or more embodiments, exposed portion of the sidewall spacer layer 230 can be removed from the fill layer 220 and from the fin liner plates 141 on the vertical fins 131 to form sidewall spacers 235 between the vertical fins 131 and fill layer 220. The exposed portion of the sidewall spacer layer 230 can be removed using a selective, directional etch (e.g., RIE).

In one or more embodiments, the exposed fin liner plates 141 removed from the top surfaces of the vertical fins 131 using a selective isotropic etch and/or selective directional etch.

In one or more embodiments, a second top source/drain 280 can be formed within the sidewall spacers 235 on the exposed top surfaces of the vertical fins 131, where the second top source/drain 280 can be formed by an epitaxial or heteroepitaxial growth process. The second top source/drain 280 can be an n-doped or p-doped semiconductor material, where the dopant type of the second top source/drain 280 can be the opposite type of doping from the first top source/drains 250 and/or can match the dopant type of the bottom source/drain layer 120. The semiconductor material can be the same as or different from the semiconductor material of the vertical fins 131 and/or the bottom source/drain layer 120. In various embodiments, the second top source/drain 280 can be a semiconductor material, including, but not limited to n-type (e.g., P or As) doped silicon (Si) or p-type (e.g., B) doped silicon-germanium (SiGe).

Figure 17:
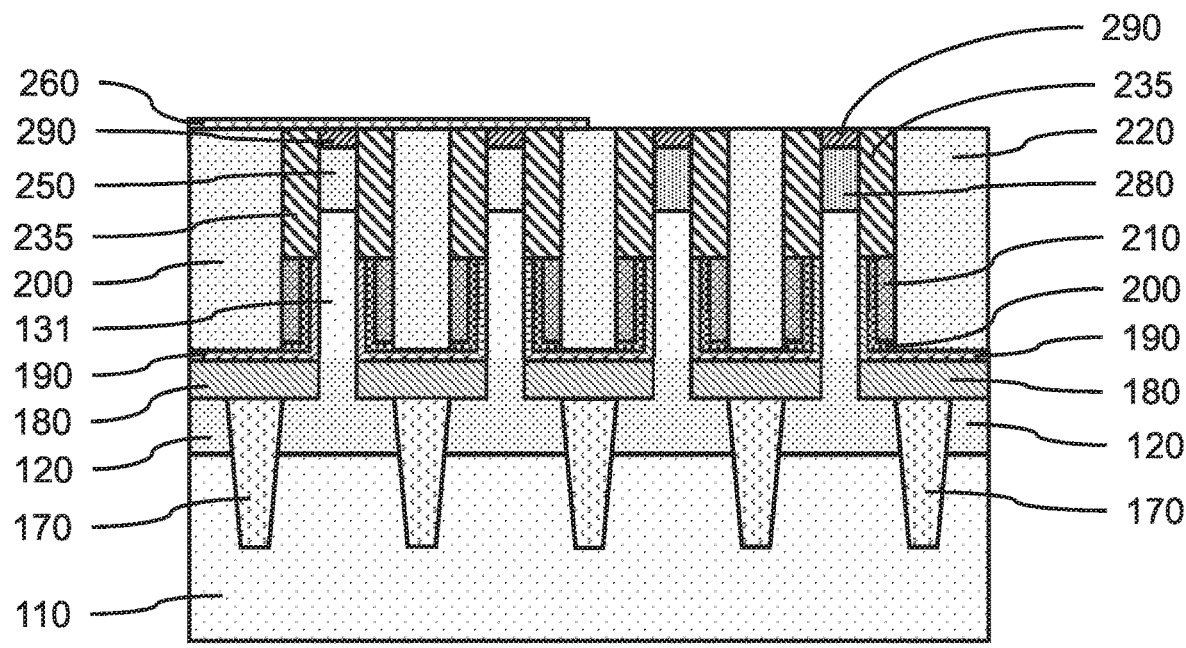
FIG. 17 is a cross-sectional side view showing the second masking layer and protective layer removed, and source/drain caps formed on the top source/drains, in accordance with an embodiment of the present invention.

FIG. 17 is a cross-sectional side view showing the second masking layer and protective layer removed, and source/drain caps formed on the top source/drains, in accordance with an embodiment of the present invention.

In one or more embodiments, the second masking layer 270 and portion of the protective layer 260 can be removed. In various embodiments, only the second masking layer 270 may be removed. The portion of the protective layer 260 can remain on the top surfaces.

In one or more embodiments, source/drain caps 290 can be formed on the first top source/drains 250 and second top source/drain 280 by recessing the first top source/drains 250 and second top source/drain 280 using a selective etch, and blanket depositing a layer of source/drain cap material. A CMP can be used to remove portions of the source/drain cap material that extends above the top surface of the fill layer 220.

Figure 18:
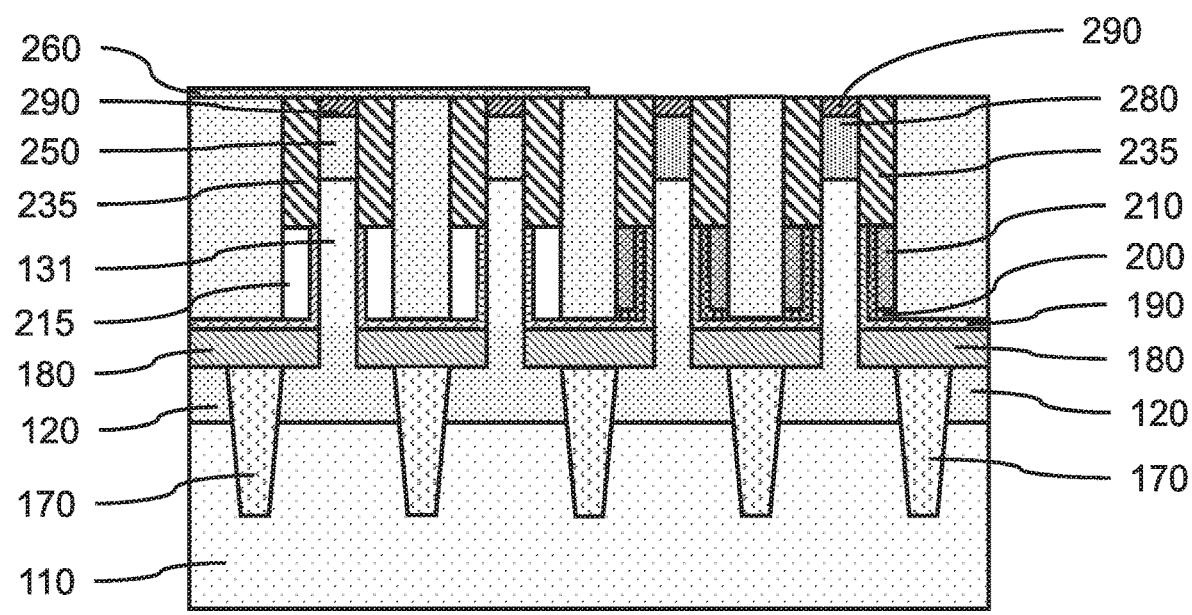
FIG. 18 is a cross-sectional side view showing the dummy gate layer and work function layer removed from around a subset of vertical fins, in accordance with an embodiment of the present invention.

FIG. 18 is a cross-sectional side view showing the dummy gate layer and work function layer removed from around a subset of vertical fins, in accordance with an embodiment of the present invention.

In one or more embodiments, the dummy gate layer 210 can be removed from around the first subset of vertical fins 131, to form void spaces 215. In various embodiments, the dummy gate layer 210 can be removed by forming a trench spaced apart from the vertical fin (e.g., in a direction into or out of the figure) and using a selective isotropic etch (e.g., wet chemical etch) to dissolve the dummy gate layer 210. Removing the dummy gate layer 210 can expose work function layer 200.

In one or more embodiments, the work function layer 200 can be removed using a selective isotropic etch (e.g., wet chemical etch) from within the void space 215, where the gate dielectric layer 190 can be exposed by removing the work function layer 200. The dummy gate layer 210 and work function layer 200 can remain around the second subset of vertical fins 131.

Figure 19:
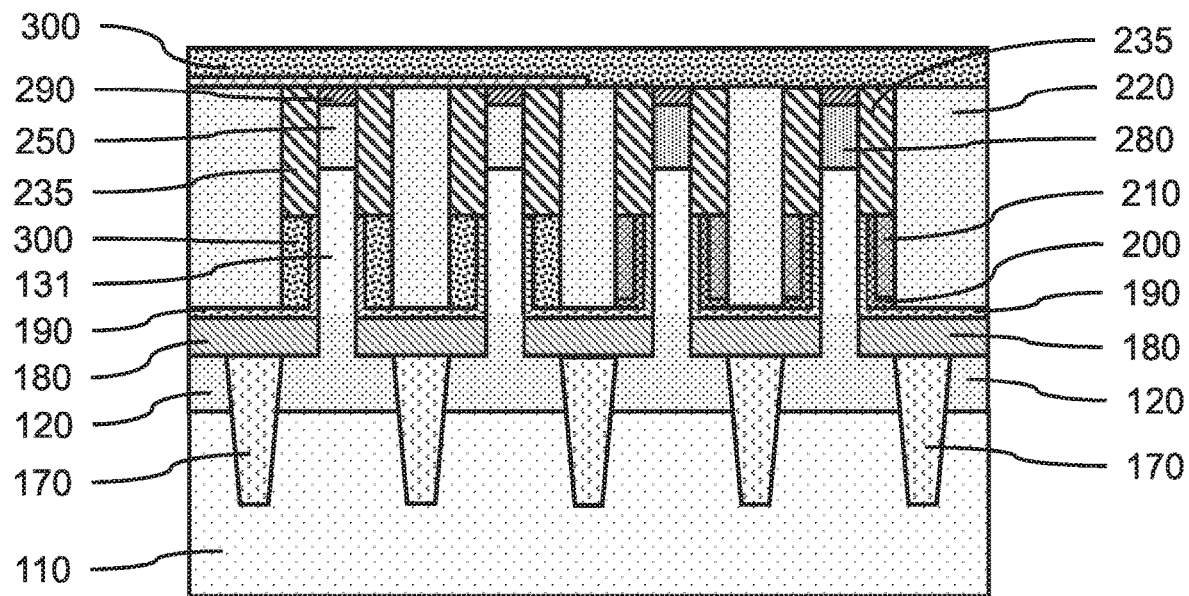
FIG. 19 is a cross-sectional side view showing a replacement work function material formed in the spaces formed by removing the dummy gate layer from around the subset of vertical fins, in accordance with an embodiment of the present invention.

FIG. 19 is a cross-sectional side view showing a replacement work function material formed in the spaces formed by removing the dummy gate layer from around the subset of vertical fins, in accordance with an embodiment of the present invention.

In one or more embodiments, a first replacement work function material 300 can be formed in the void space 215 and on the gate dielectric layer 190. In various embodiments, the replacement work function material 300 can be selected for forming an n-type VT FinFET or a p-type VT FinFET. The replacement work function material 300 can be a conducting transition metallic nitride or carbide compound material, for example, tantalum nitride (TaN), titanium nitride (TiN), tantalum carbide (TaC), titanium carbide (TiC), titanium aluminum carbide (TiAlC), and combinations thereof.

Figure 20:
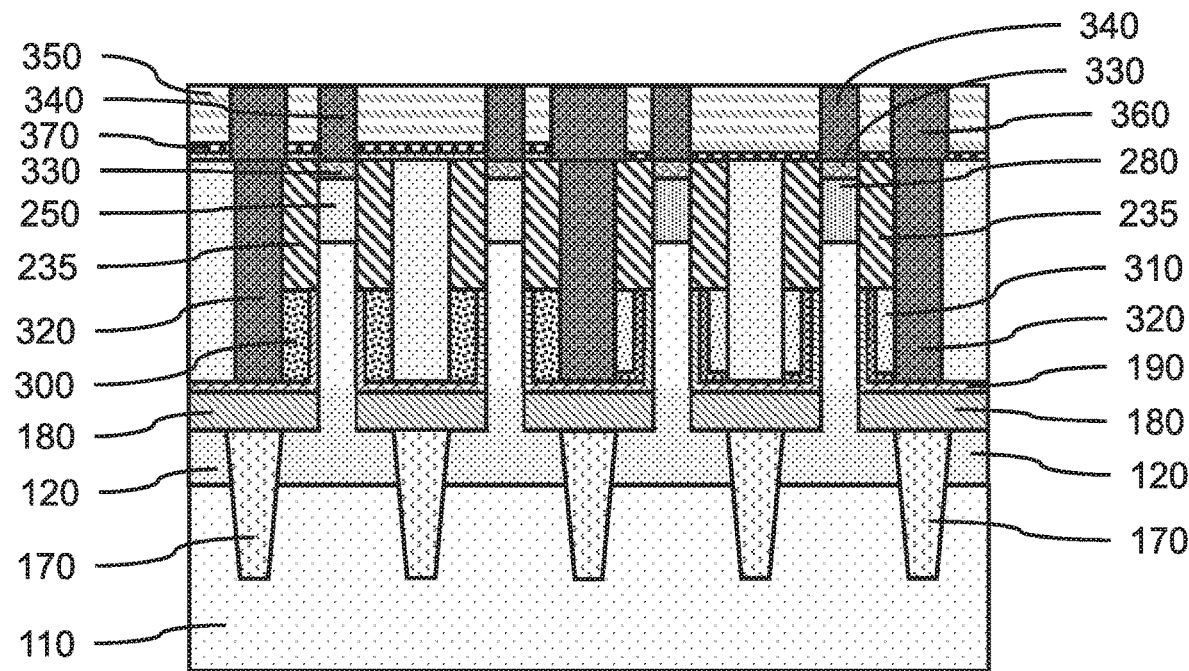
FIG. 20 is a cross-sectional side view showing a conductive gate fill formed in the spaces formed by removing the dummy gate layer from around a second subset of vertical fins, and source/drain and gate contacts formed in an interlayer dielectric (ILD) layer, in accordance with an embodiment of the present invention.

FIG. 20 is a cross-sectional side view showing a conductive gate fill formed in the spaces formed by removing the dummy gate layer from around a second subset of vertical fins, and source/drain and gate contacts formed in an interlayer dielectric (ILD) layer, in accordance with an embodiment of the present invention.

In one or more embodiments, the dummy gate layer 210 and work function layer 200 can be removed from around the second subset of vertical fins 131 using a spaced-apart trench and an isotropic etch, to form void spaces. In various embodiments, the work function layer 200 may be left on the gate dielectric layer 190.

In one or more embodiments, a second replacement work function material 310 can be formed in the void space 215 and on the gate dielectric layer 190 or the work function layer 200 if the work function layer 200 remains. In various embodiments, the second replacement work function material 310 can be selected for forming an n-type VT FinFET or a p-type VT FinFET. The second replacement work function material 310 can be a conducting transition metallic nitride or carbide compound material, for example, tantalum nitride (TaN), titanium nitride (TiN), tantalum carbide (TaC), titanium carbide (TiC), titanium aluminum carbide (TiAlC), and combinations thereof. The second replacement work function material 310 can be a different work function material from the first replacement work function material 300, so both an n-type VT FinFET and a p-type VT FinFET can be formed on adjacent portions of the substrate 110.

In one or more embodiments, portions of the first replacement work function material 300 and second replacement work function material 310 can be removed from the top surfaces of the fill layer 220, sidewall spacers 235, and source/drain caps 290.

In one or more embodiments, portions of the fill layer 220 can be removed to form open spaces adjoining the first replacement work function material 300 and/or second replacement work function material 310, where the fill layer 220 can be removed using lithographic processes and a selective isotropic and/or selective directional etch.

In one or more embodiments, a conductive gate fill 320 can be formed in the open spaces form by removing the fill layer 220, where the conductive gate fill 320 can be formed by a conformal deposition (e.g., ALD, PEALD).

In various embodiments, the conductive gate fill 320 can be a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide ($RuO_2$), cobalt silicide (CoSi), nickel silicide (NiSi)), transition metal aluminides (e.g. $Ti_3Al$, ZrAl), TaC, TaMgC, or any suitable combination of these materials.

In one or more embodiments, the source/drain caps 290 can be replaced with a silicide contact 330 for forming electrical connections between the top source/drains 250, 280 and source/drain electrical connections 340. The source/drain electrical connections 340 in an interlayer dielectric (ILD) layer 350. Gate electrical connections 360 can also be formed in the ILD layer 350 to the conductive gate fill 320.

In one or more embodiments, a second protective layer 370 can be formed on the remaining portion of the first protective layer 260 and on the exposed top surfaces of the sidewalls spacers 235 and remaining fill layer 220. The second protective layer 370 can be a dielectric material, for example, aluminum oxide (AlO), hafnium oxide (HfO), silicon nitride (SiN), and combinations thereof. Openings can be formed through the protective layers 260, 370 and interlayer dielectric (ILD) layer 350 for removing the portions of the fill layer 220.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood at yen a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating a device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a fin field effect transistor complementary metal oxide semiconductor (CMOS) device, comprising:
   forming a bottom spacer layer on a bottom source/drain layer and a plurality of vertical fins on a substrate, wherein one multilayer fin template is on each of the plurality of vertical fins;
   forming a gate dielectric layer on the plurality of vertical fins and the bottom spacer layer;
   forming a dummy gate layer on the gate dielectric layer, and the multilayer fin templates;
   removing a portion of the dummy gate layer from the gate dielectric layer from between adjacent pairs of the vertical fins;
   forming a fill layer on the gate dielectric layer between adjacent pairs of the vertical fins;
   removing a portion of the dummy gate layer from between the fill layer and the vertical fins; and
   forming a sidewall spacer layer on the fill layer and between the fill layer and the vertical fins.

2. The method of claim 1, further comprising removing a portion of the sidewall spacer layer to form sidewalls spacers between the fill layer and the vertical fins and expose a top surface of one or more of the plurality of vertical fins.

3. The method of claim 2, further comprising forming top source/drains on the exposed top surfaces of the one or more of the plurality of vertical fins.

4. The method of claim 3, further comprising removing the dummy gate layer from between the fill layer and the vertical fins to form a void space.

5. The method of claim 4, further comprising forming a first replacement work function material in the void space.

6. The method of claim 5, further comprising removing a portion of the fill layer to form an open space adjoining the first replacement work function material.

7. The method of claim 6, further comprising forming a conductive gate fill in the open space form by removing the fill layer, wherein the conductive gate fill is in physical and electrical contact with the first replacement work function material.

8. The method of claim 7, wherein the dummy gate layer is amorphous silicon (a-Si).

9. The method of claim 8, wherein the dummy gate layer is formed by atomic layer deposition (ALD).

10. A method of forming a fin field effect transistor complementary metal oxide semiconductor (CMOS) device, comprising:
    forming a bottom source/drain layer on a substrate;
    forming a plurality of multilayer fin templates and vertical fins on the bottom source/drain layer, wherein one multilayer fin template is on each of the plurality of vertical fins;
    forming a bottom spacer layer on the bottom source/drain layer and the plurality of vertical fins;
    forming a gate dielectric layer on the plurality of vertical fins and the bottom spacer layer;
    forming a dummy gate layer on the gate dielectric layer, and the multilayer fin templates;
    removing a portion of the dummy gate layer from the gate dielectric layer from between adjacent pairs of the vertical fins;
    forming a fill layer on the gate dielectric layer between adjacent pairs of the vertical fins;
    removing a portion of the dummy gate layer from between the fill layer and the vertical fins; and
    forming a sidewall spacer layer on the fill layer and between the fill layer and the vertical fins.

11. The method of claim 10, further comprising heat treating the plurality of vertical fins, multilayer fin templates, gate dielectric layer, bottom spacer layer, and dummy gate layer.

12. The method of claim 10, wherein the dummy gate layer is amorphous silicon (a-Si).

13. The method of claim 12, wherein the dummy gate layer is formed by atomic layer deposition (ALD).

14. The method of claim 13, wherein the sidewall spacer layer is silicon nitride (SiN) and formed by a conformal deposition.

15. The method of claim 14, further comprising removing a portion of the sidewall spacer layer to form sidewalls spacers between the fill layer and the vertical fins and expose a top surface of one or more of the plurality of vertical fins.

16. A method of forming a fin field effect transistor complementary metal oxide semiconductor (CMOS) device, comprising:
    forming a plurality of multilayer fin templates and vertical fins on a bottom source/drain layer, wherein one multilayer fin template is on each of the plurality of vertical fins;
    forming a bottom spacer layer on the bottom source/drain layer and the plurality of vertical fins;

depositing a gate dielectric layer on the plurality of vertical fins and the bottom spacer layer;

depositing a work function layer on the gate dielectric layer;

forming a dummy gate layer on the gate dielectric layer, and the multilayer fin templates;

removing a portion of the dummy gate layer from the gate dielectric layer from between adjacent pairs of the vertical fins;

forming a fill layer on the gate dielectric layer between adjacent pairs of the vertical fins;

removing a portion of the dummy gate layer and gate dielectric layer from between the fill layer and the vertical fins;

forming a sidewall spacer layer on the fill layer and between the fill layer and the vertical fins; and removing a portion of the sidewall spacer layer from a first subset of the plurality of vertical fins to form sidewall spacers on remaining portions of the dummy gate layer and gate dielectric layer between the vertical fin and fill layer.

17. The method of claim 16, further comprising heat treating the plurality of vertical fins, multilayer fin templates, gate dielectric layer, bottom spacer layer, and dummy gate layer.

18. The method of claim 17, further comprising replacing the multilayer fin templates on the first subset of the plurality of vertical fins with first top source/drain(s).

19. The method of claim 18, further comprising replacing the multilayer fin templates on a second subset of the plurality of vertical fins with second top source/drain(s).

20. The method of claim 19, further comprising, removing the dummy gate layer and work function layer from around the first subset of vertical fins to form void space(s), and forming replacement work function material in the void space(s).

* * * * *